US 7,079,321 B2

(12) United States Patent
Coston et al.

(10) Patent No.: US 7,079,321 B2
(45) Date of Patent: Jul. 18, 2006

(54) ILLUMINATION SYSTEM AND METHOD ALLOWING FOR VARYING OF BOTH FIELD HEIGHT AND PUPIL

(75) Inventors: Scott D. Coston, New Milford, CT (US); Richard J. Guerra, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/812,978

(22) Filed: Mar. 31, 2004

(65) Prior Publication Data

US 2005/0007677 A1      Jan. 13, 2005

Related U.S. Application Data

(63) Continuation-in-part of application No. 10/270,556, filed on Oct. 16, 2002, now Pat. No. 6,775,069, and a continuation-in-part of application No. 10/166,062, filed on Jun. 11, 2002, now Pat. No. 6,813,003.

(60) Provisional application No. 60/329,758, filed on Oct. 18, 2001.

(51) Int. Cl.
*G02B 27/10* (2006.01)
*G02B 15/14* (2006.01)

(52) U.S. Cl. .................. 359/624; 359/694; 359/696; 359/676

(58) Field of Classification Search ........ 359/624–626, 359/686–697, 676, 672
See application file for complete search history.

(56) References Cited

U.S. PATENT DOCUMENTS

| | | | |
|---|---|---|---|
| 4,918,583 A | 4/1990 | Kudo et al. | 366/268 |
| 4,931,830 A | 6/1990 | Suwa et al. | 355/71 |
| 5,343,489 A | 8/1994 | Wangler | 372/93 |
| 5,383,000 A | 1/1995 | Michaloski et al. | 355/67 |
| 5,623,479 A * | 4/1997 | Takahashi | 369/53.15 |
| 5,631,721 A | 5/1997 | Stanton et al. | 355/71 |
| 5,675,401 A | 10/1997 | Wangler et al. | 355/67 |
| 5,844,727 A | 12/1998 | Partlo | 359/710 |
| 6,243,206 B1 | 6/2001 | Wangler | 359/621 |
| 6,285,443 B1 | 9/2001 | Wangler et al. | 355/67 |
| 6,307,682 B1 | 10/2001 | Hoffman et al. | 359/663 |

(Continued)

FOREIGN PATENT DOCUMENTS

DE      44 21 053 A1      12/1995

(Continued)

OTHER PUBLICATIONS

English Abstract for European Patent Publication No. EP1079227, 1 page, data supplied from the espacenet database.

(Continued)

*Primary Examiner*—Timothy Thompson
(74) *Attorney, Agent, or Firm*—Sterne, Kessler, Goldstein & Fox P.L.L.C

(57)      ABSTRACT

A method and system allow for changing (continuously or variably) both a field height and pupil of a beam that illuminates an object field. In one example, the object field can have a pattern generator (e.g., one or more reticles, spatial light modulators, or the like) positioned therein. The system and method for changing both the field height and the pupil can include a field defining element, a pupil defining element, and first and second zoom systems. The field defining element (FDE) can generate a field height of an illumination beam. The first zoom system can allow for changing of the field height of the illumination beam. The pupil defining element (PDE) can generate a pupil of the illumination beam. The second zoom system can allow for changing of the pupil of the illumination beam.

23 Claims, 15 Drawing Sheets

U.S. PATENT DOCUMENTS

| | | |
|---|---|---|
| 6,563,567 B1 | 5/2003 | Komatsuda et al. .......... 355/71 |
| 6,583,937 B1 | 6/2003 | Wangler et al. ............. 359/624 |
| 6,631,721 B1 | 10/2003 | Salter et al. ........... 128/231.21 |
| 6,775,069 B1 | 8/2004 | Oskotsky et al. ........... 359/624 |
| 6,813,003 B1 | 11/2004 | Oskotsky et al. ............. 355/67 |
| 2001/0055107 A1 | 12/2001 | Tsuji .......................... 355/67 |
| 2002/0036763 A1* | 3/2002 | Krikke et al. ................. 355/67 |
| 2002/0085276 A1 | 7/2002 | Tanitsu et al. .............. 359/432 |
| 2002/0171944 A1 | 11/2002 | Suenaga et al. ............ 359/689 |
| 2003/0025890 A1 | 2/2003 | Nishinaga .................... 355/53 |
| 2003/0076679 A1 | 4/2003 | Oskotsky et al. ........... 362/268 |
| 2003/0090638 A1 | 5/2003 | Koehler et al. |
| 2003/0160949 A1* | 8/2003 | Komatsuda et al. .......... 355/71 |
| 2003/0227609 A1 | 12/2003 | Oskotsky et al. ............. 355/67 |
| 2004/0051953 A1 | 3/2004 | Mizouchi .................... 359/619 |
| 2004/0179270 A1 | 9/2004 | Coston et al. ............. 359/624 |
| 2004/0263821 A1 | 12/2004 | Oskotsky et al. ............. 355/67 |
| 2005/0007677 A1 | 1/2005 | Coston et al. ............. 359/663 |

FOREIGN PATENT DOCUMENTS

| | | |
|---|---|---|
| EP | 0 747 772 A1 | 12/1996 |
| EP | 1 014 196 A2 | 6/2000 |
| EP | 1 079 227 A1 | 2/2001 |
| EP | 1 170 635 A2 | 1/2002 |
| EP | 1 180 726 A2 | 2/2002 |
| EP | 1 211 561 A2 | 6/2002 |
| EP | 1 248 151 A2 | 10/2002 |
| EP | 1 291 720 A2 | 3/2003 |
| EP | 1 372 034 A2 | 12/2003 |
| WO | WO 01/61411 A1 | 8/2001 |

OTHER PUBLICATIONS

Copy of Search Report from European Patent Appl. No. EP 03013136.1-1226-, 4 pages, issued Apr. 28, 2005.

Copy of Search Report from Singapore Patent Appl. No. SG200304444-3, 6 pages, mailing date Jan. 6, 2004.

International Search Report from Singapore Appl. No. 200206364-2, filed Oct. 18, 2002, 5 pages, mailed Nov. 11, 2005.

* cited by examiner

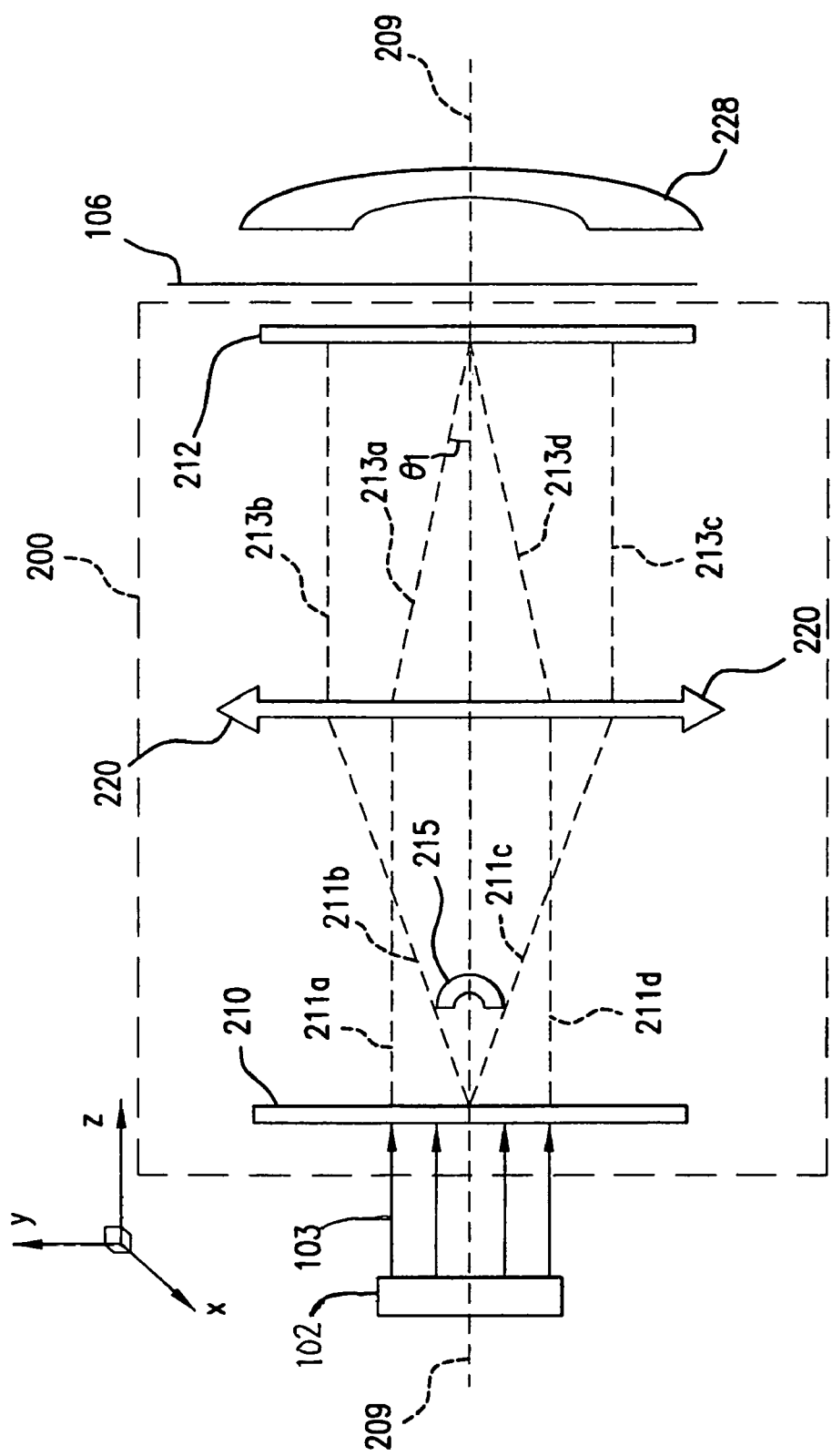

ILLUMINATION SYSTEM AND METHOD ALLOWING FOR VARYING OF BOTH FIELD HEIGHT AND PUPIL

CROSS-REFERENCE TO RELATED APPLICATIONS

This application is a continuation-in-part of U.S. Ser. No. 10/270,556, filed Oct. 16, 2002, entitled "Advanced Illumination System For Use In Microlithography," (now U.S. Pat. No. 6,775,069 that issued Aug. 10, 2004), which claims priority under 35 U.S.C. §119(e) to U.S. Provisional Patent Application No. 60/329,758, to Oskotsky et al., filed Oct. 18, 2001, which are both incorporated herein by reference in their entireties.

This application is also a continuation-in-part of U.S. Ser. No. 10/166,062, to Oskotsky et al., entitled "Advanced Illumination System for Use in Microlithography," filed Jun. 11, 2002 (now U.S. Pat. No. 6,813,003 that isued Nov. 2, 2004), which is incorporated by reference herein in its entirety.

This application is related to U.S. Ser. No. 10/808,436, filed Mar. 25, 2004, to Coston et al., which is incorporated by reference herein in its entirety.

BACKGROUND OF THE INVENTION

1. Field of the Invention

The present invention relates generally to illumination systems that can be used in lithography tools.

2. Background Art

Lithography can be used to fabricate patterns on substrates, semiconductor wafers, flat panel displays (glass substrates), and like. For ease of explanation, the description in the specification will be based on semiconductor fabrication. In lithography, various wavelengths of light are used, depending on a size of a feature being pattered, to image patterns onto the semiconductor wafer. Many types of semiconductor devices, such as diodes, transistors, and integrated circuits, can be fabricated using lithographic techniques.

A lithography system typically includes an illumination system that illuminates a pattern generator containing a pattern (e.g., a reticle (also called a mask), a spatial light modulator or contrast device (a digital mirror device, a grating light valve, a liquid crystal display), or the like, hereinafter all are referred to as pattern generator) to image the pattern, via a projection system, on a semiconductor wafer in an exposure system. Typically, the illumination system illuminates a region of the pattern generator and the projection system projects an image of the illuminated region onto the wafer.

As semiconductor device manufacturing technology advances, there are ever increasing demands on each component of the lithography system used to manufacture the semiconductor device. This includes the illumination system used to illuminate the pattern generator. For example, there is a need to illuminate the pattern generator with an illumination field having uniform irradiance. In step-and-scan lithography, there is also a need to continuously vary a size of the illumination field in a direction perpendicular to a wafer scan direction, so that the size of the illumination field can be tailored to different applications. One factor often limiting wafer processing throughput is the amount of energy available from the illumination system. As a result, there is a need to vary the size of the illumination field without a loss of energy.

As the size of the illumination field is varied, it is important to preserve the angular distribution and characteristics of the illumination field at the pattern generator. To achieve this goal, the illumination system must maintain telecentric illumination at a substantially fixed numerical aperture at the pattern generator as the size of the illumination field is varied. Some illumination systems include a scattering optical element, such as an array, positioned before the pattern generator. The scattering optical element produces a desired angular light distribution that is subsequently imaged or relayed to the pattern generator. In such an illumination system, there is a need to maintain telecentric illumination at a substantially fixed numerical aperture at the scattering optical element, and correspondingly, at the pattern generator, as the size of the illumination field is varied.

A standard zoom lens can vary the size of the illumination field. However, in the standard zoom lens, image magnification, and correspondingly the size of the illumination field, is inversely proportional to angular magnification. Thus, a standard zoom lens that increases the size of an image by a factor M, disadvantageously decreases the numerical aperture by a factor 1/M, and fails to preserve the angular distribution of the illumination field.

In conventional systems, only one of a field height or pupil can be varied, while maintaining constant radiometric efficiency. Thus, in systems that have the capability to continuous vary a field height, hard apertures are inserted to create fixed pupils, which reduces radiometric efficiency. Similarly, systems that have continuously varying pupils require hard apertures to reduce the field height, which again reduces radiometric efficiency.

Therefore, what is needed is a system and method that allow for varying both a field height and pupil of an illumination beam, possibly continuously (dynamically), while desirably maintaining radiometric efficiency of a system.

BRIEF SUMMARY OF THE INVENTION

An embodiment of the present invention provides a system and method that creates the ability to both continuously (dynamically) vary or change field height and continuously (dynamically) vary or change a pupil through the use of first and second zoom systems. A first zoom system can be used to generate an appropriate field shape and size in a device that generates a fixed range of illumination pupil angles and a second zoom system can be used to vary the pupil in shape and size.

Another embodiment of the present invention provides a system including a field defining element, a pupil defining element, and first and second zoom systems. The field defining element (FDE) generates a field height of an illumination beam. The first zoom system allows for changing of the field height of the illumination beam. The pupil defining element (PDE) generates a pupil of the illumination beam. The second zoom system allows for changing of the pupil of the illumination beam. In some applications, the illumination beam can be used to illuminate an object plane that may contain a pattern generator, such as in lithography or maskless lithography.

A still further embodiment of the present invention provides a system including a device for varying a field height of an illumination beam and a device for varying a pupil of the illumination beam, so that radiometric efficiency is maintained. The system may also include one or more of the following: a device for relaying the illumination beam, a device for measuring a characteristic of the illumination beam and generating a control signal, and a device for controlling at least one of the device for varying the field height and a device for varying the pupil based on a value of the control signal.

The above embodiments can allow for a higher radiometric efficiency over a range of field heights and a range of pupils, that increase flexibility of a lithographic fabrication process, and that improve matching of pupil and field height between lithographic tools.

Further features and advantages of the present invention as well as the structure and operation of various embodiments of the present invention are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 2b illustrates another embodiment of an illumination system according to the present invention.

Figure 1:
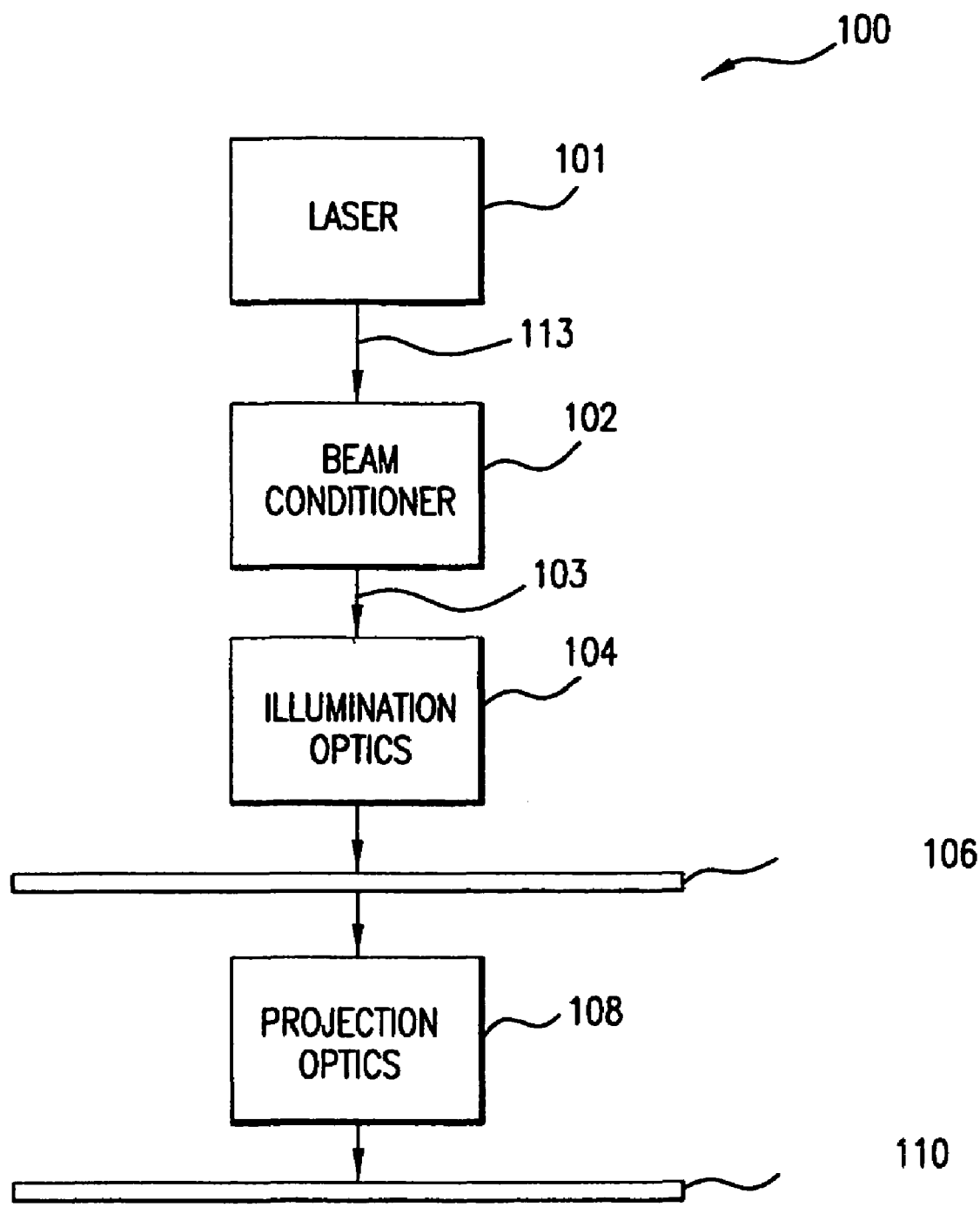
FIG. 1 illustrates an example environment for the present invention, a lithographic system.

The present invention is described with reference to the accompanying drawings. In the drawings, like reference numbers may indicate identical or functionally similar elements. Additionally, the leftmost digit of a reference number may identify the drawing in which the reference number first appears.

DETAILED DESCRIPTION OF THE INVENTION

Overview

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

An embodiment of the present invention provides a method and system that allow for changing (possibly continuously and/or dynamically) of both a field height and pupil of a beam that illuminates an object field. In one example, the object field can have a pattern generator (e.g., a reticle, a spatial light modulator, or the like) positioned therein, for example in a lithography or maskless lithography system. The system and method can use a field defining element, a pupil defining element, and first and second zoom systems. The field defining element (FDE) can generate a field height of an illumination beam. The first zoom system can allow for changing of the field height of the illumination beam. The pupil defining element (PDE) can generate a pupil of the illumination beam. The second zoom system can allow for changing of the pupil of the illumination beam.

Exemplary Environment: A Lithography System

FIG. 1 illustrates an exemplary environment where the present invention can be implemented. An optical system 100 includes an illumination source 101 (e.g., a light source, a laser, etc.) that produces a light beam 113. The light 113 is conditioned in a beam conditioner 102, which transmits conditioned light 103 to illumination optics 104. Illumination optics 104 produces illumination light from the conditioned light 103, which is used to illuminate an object plane that can include a pattern generator 106 (e.g., one or more reticles, spatial light modulators, or the like). Pattern generator 106 is used to pattern the illumination light to form patterned exposure light that is projected onto a substrate 110 (e.g., a semiconductor wafer, a flat panel display glass substrate, or the like) via projection optics 108. It is to be appreciated that pattern generator 106 can be transmissive or reflective.

Illumination source 101 may be a laser that produces light beam 113 having any wavelength, such as visible light, extreme ultraviolet light, deep ultraviolet light, or any other wavelength of light within or not in the visible region. An example application of the present invention uses wavelengths which include, but are not limited to, 248 nanometers (nm), 193 nm, and 157 nm. Additionally, illumination source 101 may be a pulsed laser or a continuous wave laser.

In one embodiment, beam conditioner 102 can produce a collimated beam having a defined cross-section. This can be accomplished using a beam expander, such as a refractive optical system or a reflective optical system.

Figure 2A:
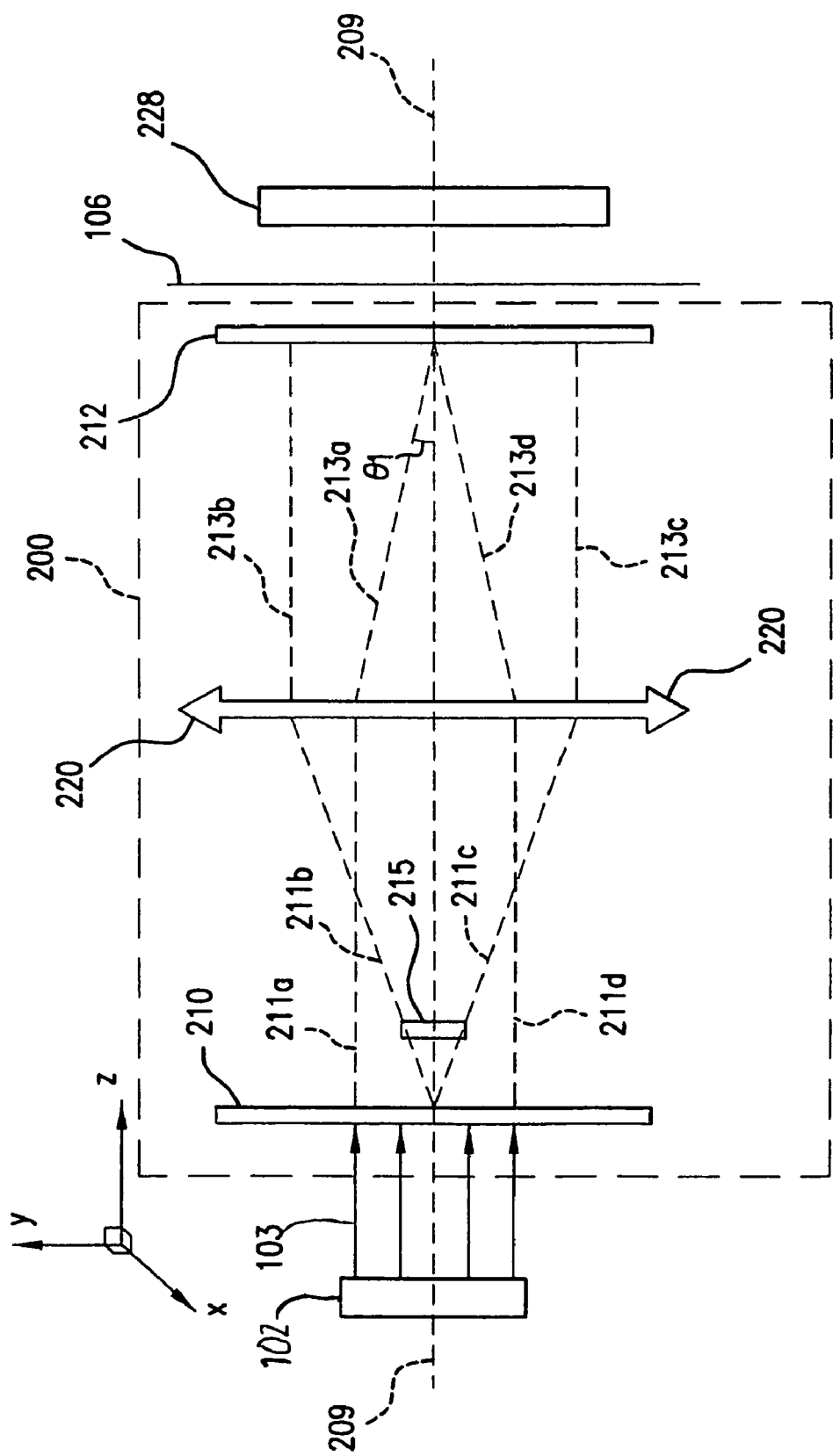
FIG. 2a illustrates an embodiment of an illumination system according to the present invention.

FIG. 2a illustrates an embodiment of an illumination system 200 for illuminating the object plane, which can include pattern generator 106, according to the present invention. For ease of description, a reticle (also referred to as "delimiter") will be used for pattern generator 106. However, other pattern generators 106 are contemplated within the scope of the present invention (e.g., contrast devices, spatial light modulators, and the like).

Illumination optics 104 can include illumination system 200. Illumination system 200 can include a first device 210, which can be a diffractive array or a refractive array that creates the field, a second device 212, which can be a diffractive array or a refractive array that creates the pupil, and a condenser system 220 placed in an optical path between first field array 210 and second pupil array 212. In one embodiment of illumination system 200, the above-described optical elements are placed along an optical axis 209.

First field array 210 processes conditioned light 103. In various embodiments, first field array 210 can be a double diffractive array, a diffractive grid, or a microlens assembly that allows passage of light in the first, second, third and so forth order, or the like. First field array 210 can diffract light so that each order represents passage of light at different angles. First field array 210 can provide spatial and temporal coherence treatment for conditioned light 103 entering illumination system 200. Furthermore, first field array 210 can allow for a high transmission of light.

Light 213a–d from condenser system 220 is incident upon second pupil array 212. Second pupil array 212 may change the magnitude of impinging light to form a delimiter field 228. The size and/or shape of delimiter field 228 may indicate how much light is incident upon reticle 106. Second pupil array 212 can also be a double diffractive array and/or can include a diffractive grid or a microlens assembly. Second pupil array 212 can provide spatial and temporal coherence treatment. Also, second pupil array 212 can allow for a high transmission of light.

Condenser system 220 can allow the light passing through illumination system 200 to vary the size of delimiter field 228. In one embodiment, condenser system 220 can include a plurality of lenses that vary magnitude of the light passing through condenser system 220 and a size of delimiter field 228. The plurality of lenses in condenser system 220 can expand and/or reduce the magnitude of the light. Condenser system 220 can include a plurality of cylindrical lenses and/or cross-cylindrical lenses. Various embodiments of condenser system 220 are described below with respect to FIGS. 3a–4d.

Figure 5B:
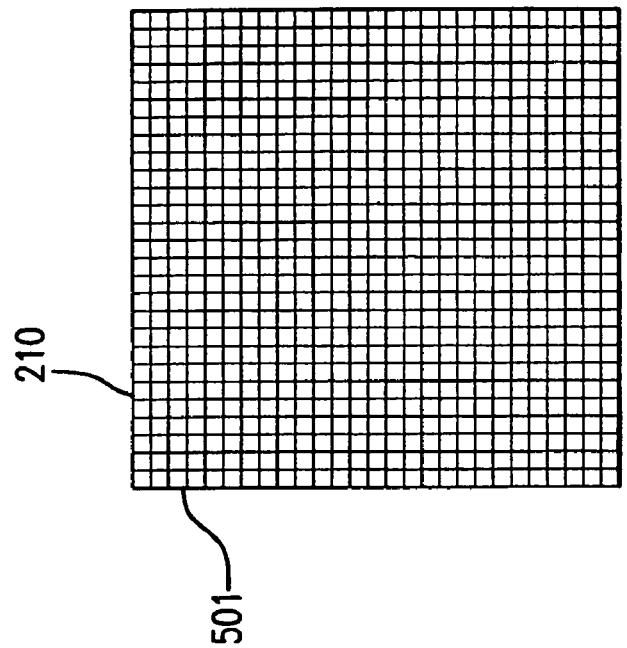
FIG. 5b is a top view of a diffractive grid within the diffractive array, according to the present invention.
Figure 5A:
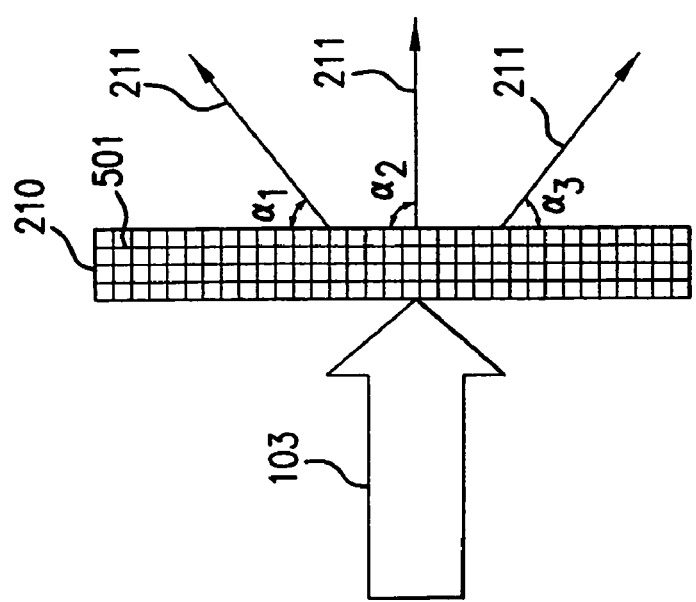
FIG. 5a is a side view of a diffractive grid within a diffractive array, according to the present invention.

FIGS. 5a and 5b illustrate a side view and a front view, respectively, of an exemplary diffractive grid embodiment of first diffractive array 210 according to the present invention. Conditioned light 103 passes through a diffractive grid 501 of first field array 210. Diffractive grid 501 transmits conditioned light 103 at different angles $\alpha_1$, $\alpha_2$, and $\alpha_3$ with respect to optical axis 209 (FIG. 2a), as shown in FIG. 5a.

Figure 6B:
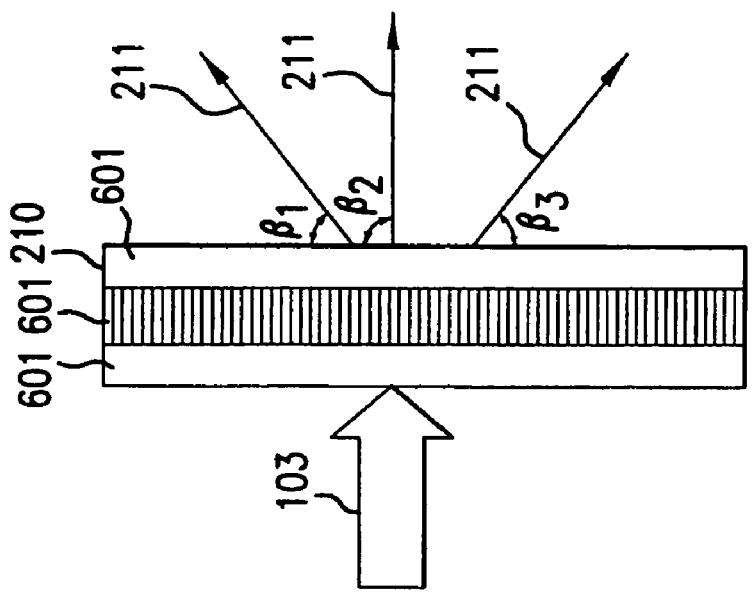
FIG. 6b is a side view of a microlens assembly within the diffractive array, according to the present invention.
Figure 6A:
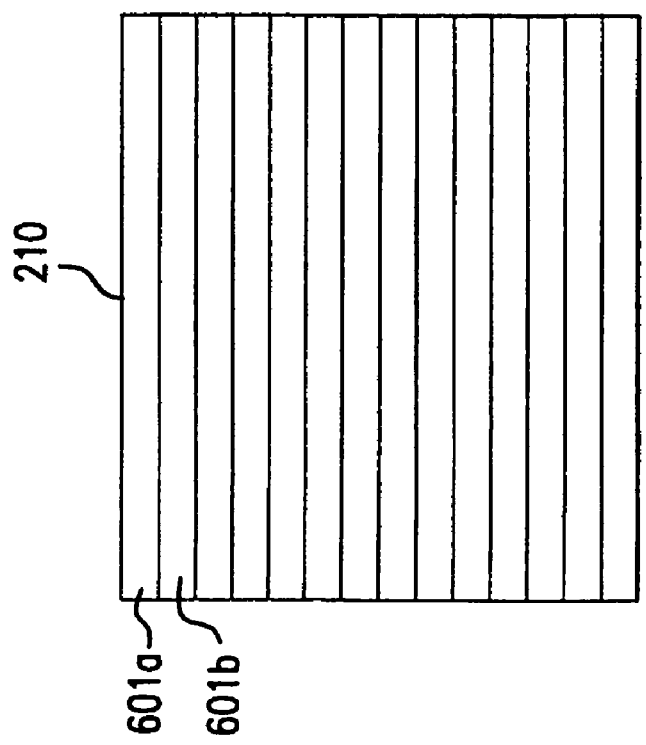
FIG. 6a is a top view of a microlens assembly within the diffractive array, according to the present invention.

FIGS. 6a and 6b illustrate a front view and a side view, respectively, of another embodiment of first field array 210 according to the present invention. In this embodiment, first field array 210 includes a plurality of microlenses 601. Microlenses 601 can be placed in a variety of configurations as shown in FIG. 6b. First field array 210 can include a plurality of microlens assemblies 601 variably aligned. Microlenses 601 can be placed parallel to the Y-axis and/or parallel to the X-axis. Microlenses 601 receive conditioned light 103 and transmit it at various angles $\beta_1$, $\beta_2$, and $\beta_3$ with respect to optical axis 209 (FIG. 2a), as shown in FIG. 6b.

Referring back to FIG. 2a, conditioned light 103 is directed along optical axis 209 towards reticle 106. First field array 210 receives conditioned light 103. After processing conditioned light 103, first field array 210 directs light 211a–d towards condenser system 220. The light 211a–d contains a pattern imparted on it via pattern generator 106. After passing through first field array 210, light 211a–d has a numerical aperture 215. Numerical aperture 215 indicates a size and/or shape of delimiter field 228. Numerical aperture (NA$_1$) 215 is defined as follows:

$$NA_1 = n*\sin(\theta_1)$$

In this formula, n is an index of refraction of the optical propagating medium (in this case, air) and $\theta_1$ is an angle of being refracted, formed by the light generating delimiter field 228. Therefore, size of numerical aperture (NA$_1$) 215 controls the size of delimiter field 228. In other words, the larger the numerical aperture 215, the larger the delimiter field 228. The shape of numerical aperture 215 also controls the shape of delimiter filed 228. For example, in the embodiment shown in FIG. 2a, numerical aperture 215 is rectangular, therefore delimiter field 228 is rectangular. As another example, in the embodiment shown in FIG. 2b, numerical aperture 215 has an arc shape, therefore delimiter field 228 has an arc shape. Other shapes and sizes of numerical aperture 215 and its corresponding delimiter field 228 are possible. In other words, first field array 210 can be modified so that the light 211 can have any size and/or shape numerical aperture 215. Hence, light 213 can subsequently form corresponding size and/or shape delimiter field 228.

First field array 210 directs light 211 towards condenser system 220 along optical axis 209. Condenser system 220 can be used to change a size of delimiter field 228. Condenser system 220 can generate a zoomable field in a cross-scan direction. For example, as shown in FIG. 2a a scan direction can be along axis 209, or in an X direction, while a cross-scan direction in this figure would be along the X axis. The condenser system 220 can be anamorphic to achieve generation of the zoomable field. In other words, the light passing through condenser system 220 is capable of varying size of delimiter field 228 in the Y-direction. Condenser system 220 is also capable of preserving or maintaining an angular distribution of light incident on second pupil array 212, while the light passing through condenser system 220 is varying the size of the delimiter field 228. Condenser system 220 can maintain a uniform radiant flux density of light (radiant flux incident per unit area of a surface), while the size of delimiter field 228 (and, hence, the amount of light incident upon reticle 106) is varied. For example, the light passing through condenser system 220 is able to vary delimiter field 228 in a range from about 11 mm to about 26 mm. A size and/or shape of delimiter field 228 can be application specific. Various embodiments of condenser system 220 are described in reference to FIGS. 3a–4d.

Condenser System

In accordance with one embodiment of the present invention, condenser system 220 can substantially preserve and maintain a predetermined angular distribution of light incident upon reticle 106, while the size of the delimiter field 228 is varied. To achieve this, condenser system 220 can maintain telecentric illumination at numerical aperture 215, while the size of the delimiter field 228 is varied. Condenser system 220 also can maintain a uniform irradiance and a predetermined amount of energy that is transferred to reticle 106 by illumination system 200, while the size of the delimiter field 228 is varied. The operation of condenser system 220 is described further below.

FIGS. 3a–3d illustrate a 4-lens condenser system 220 according to an embodiment of the present invention, while FIGS. 4a–4d illustrate 5-lens condenser system 220 according to another embodiment of the present invention.

Lens Condenser System

Figure 3A:
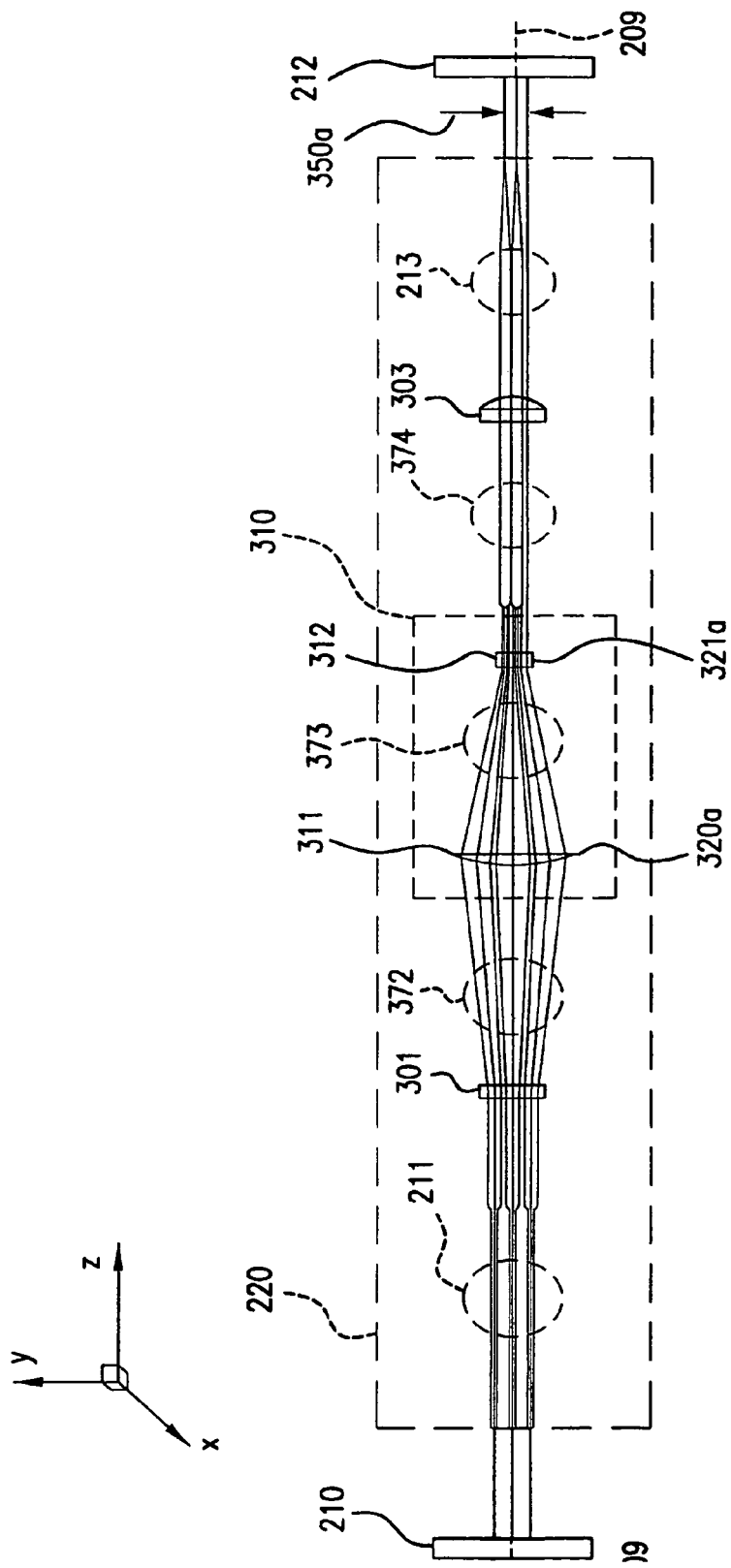
FIG. 3a illustrates an embodiment of a 4-lens condenser system of the illumination system of FIGS. 2a and 2b in a first lens position, according to the present invention.

FIG. 3a illustrates 4-lens condenser system 220 according to an embodiment of the present invention. 4-lens condenser system 220 can include an input lens 301, an output lens 303, and a zoom lens section 310. Zoom lens section 310 is placed along optical axis 209 between input lens 301 and output lens 303. Zoom lens section 310 can include a first zoom lens 311 and a second zoom lens 312.

In this embodiment, input lens 301 and output lens 303 are stationary lenses and zoom lens section 310 is capable of translation along optical axis 209 between input lens 301 and output lens 303. First zoom lens 311 is capable of translation along optical axis 209 between input lens 301 and second zoom lens 312. Second zoom lens 312 is capable of translation along optical axis 209 between first zoom lens 311 and output lens 303. By translating first zoom lens 311 and/or second zoom lens 312 along optical axis 209, zoom lens section 310 translates along optical axis 209 between input lens 301 and output lens 303.

By adjusting respective distances between input lens 301, first zoom lens 311, second zoom lens 312, and output lens 303 condenser system 220 condenses a light passing through the condenser system 220. The condensed light forms an illumination field 350 before the condensed light passes through second diffractive array 212. Illumination field 350 can be used to establish the size of delimiter field 228 formed at reticle 106. As used herein, condensed light means light having expanded and/or reduced magnitude. The condensed light output from condenser system 220 is capable of varying the size of illumination field 350. Furthermore, the refractive power of input lens 301, first zoom lens 311, second zoom lens 312, and output lens 303 also affects the magnitude of light passing through condenser system 220 and, hence, affects the size of illumination field 350. Depending on the size of illumination field 350, input lens 301, output lens 303, first zoom lens 311, and second zoom lens 312 can have positive or negative refractive power.

In one embodiment, input lens 301 and output lens 303 can be cylindrical lenses having optical powers in a cross-scanning direction (or along the X and the Y axis) and first zoom lens 311 and second zoom lens 312 can be cylindrical lenses having optical powers in a scanning direction (or along the Y-axis or along the X-axis).

In one embodiment, in order to minimize energy loss and/or a range of motion of lenses in zoom lens group 310 during operation of condenser system 220, the ratio of cross-scan optical powers of lenses in zoom lens group 310 can be in the range from about 1:−0.3 to about 1:−0.8. In the alternative, lenses in the condenser system 220 can be cross-cylindrical lenses.

Figure 3B:
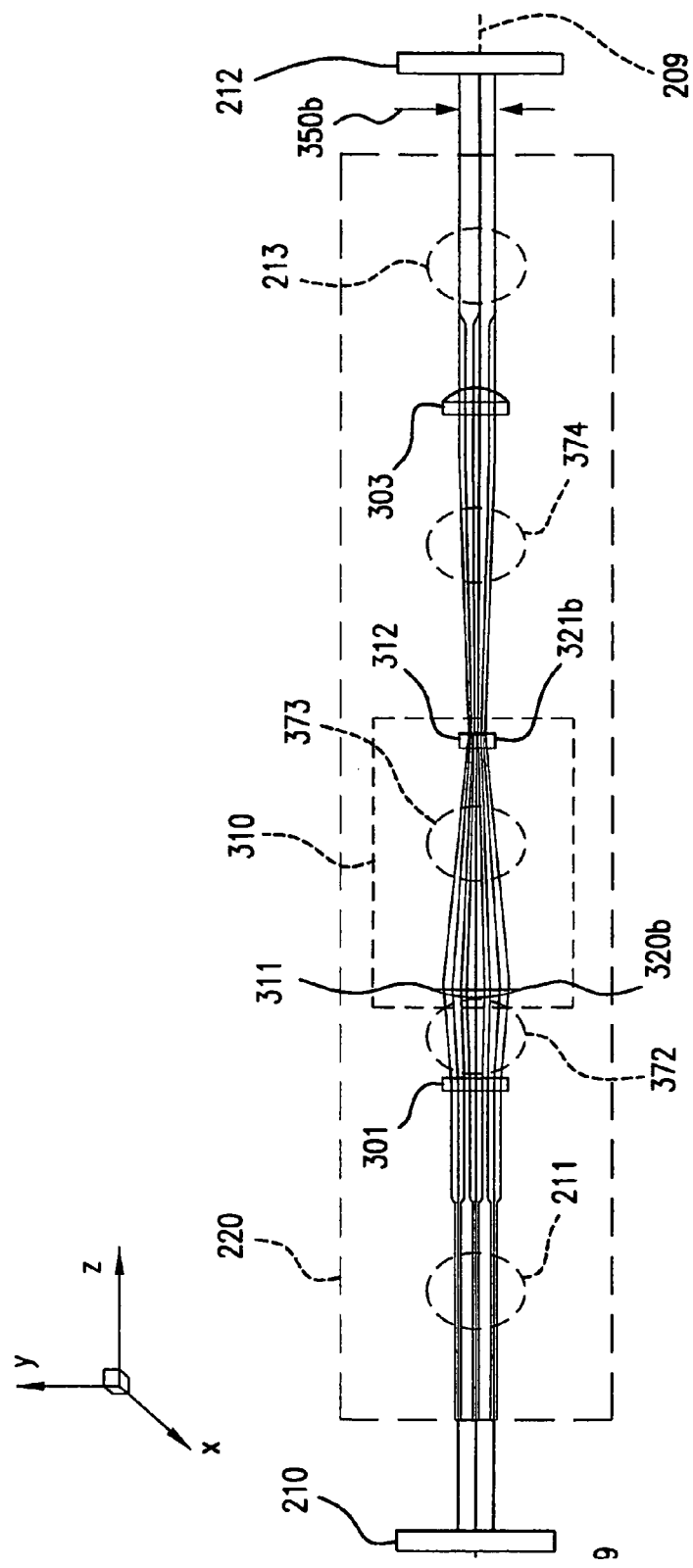
FIG. 3b illustrates the 4-lens condenser system shown in FIG. 3a in a second lens position, according to the present invention.
Figure 3C:
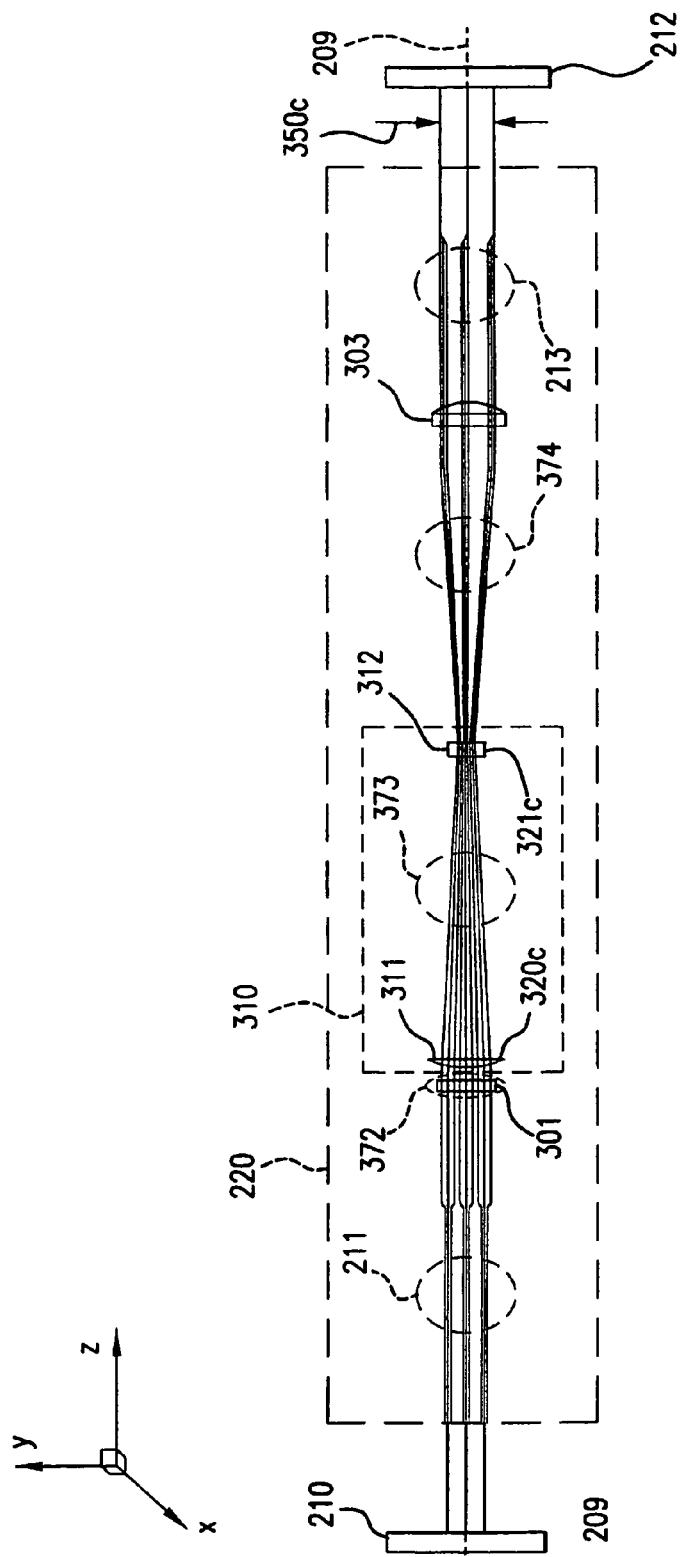
FIG. 3c illustrates the 4-lens condenser system shown in FIG. 3a in a third lens position, according to the present invention.
Figure 3D:
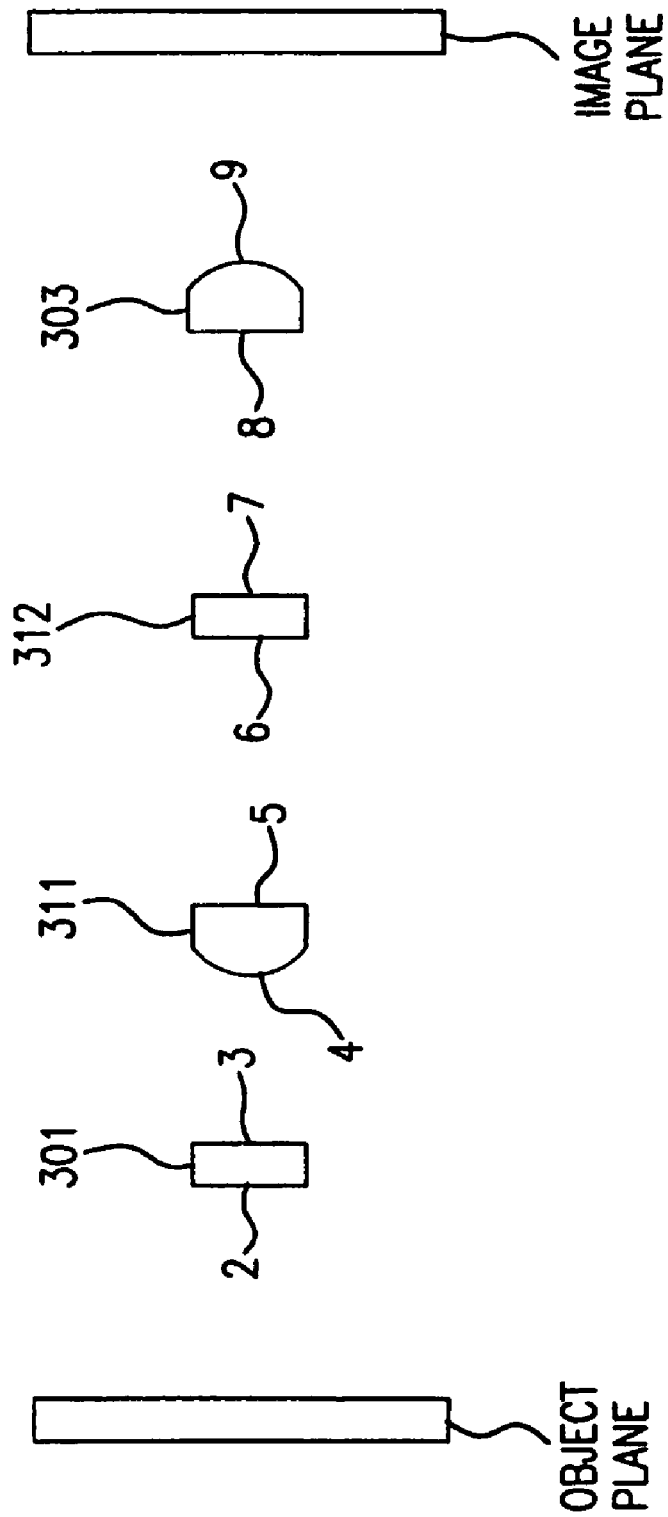
FIG. 3d illustrates a plurality of optical elements along with corresponding optical surfaces of the 4-lens condenser system shown in FIGS. 3a–3c, according to the present invention.

FIG. 3d illustrates optical elements with corresponding optical surfaces of condenser system 220 according to an embodiment of the present invention. Input lens 301 has optical surfaces 2 and 3, first zoom lens 311 has optical surfaces 4 and 5, second zoom lens 312 has optical surfaces 6 and 7, and output lens 303 has optical surfaces 8 and 9. The optical elements are placed between an object plane and an image plane. Tables 1A and 1B, shown above, indicate optical properties of each optical element in condenser system 220 (input lens 301, first zoom lens 311, second zoom lens 312, and output lens 303), such as thickness, radius, material and others.

Light Path in 4-Lens Condenser System

Referring again to FIG. 3a, a first embodiment of zoom lens section 310 is shown. Light 211 is incident upon input lens 301 of condenser system 220. Input lens 301 changes the magnitude of light 211. As used herein, the term changing the magnitude of the light means expanding and/or reducing the magnitude of the light. After being refracted by input lens 301, light 211 becomes first condensed light 372. As used herein, the term condensed light means a light having expanded and/or reduced magnitude. Input lens 301 directs first condensed light 372 towards zoom lens section 310.

First zoom lens 311 of zoom lens section 310, while in position 320a, receives first condensed light 372. First zoom lens 311 changes the magnitude of first condensed light 372. After being refracted by first zoom lens 311, first condensed light 372 becomes second condensed light 373. First zoom lens 311 directs second condensed light 373 towards second zoom lens 312, which is in position 321a.

Second zoom lens 312 receives second condensed light 373. Second zoom lens 312 changes the magnitude of second condensed light 373. After being refracted by second zoom lens 312, second condensed light 373 becomes third condensed light 374. Second zoom lens 312 directs third condensed light 374 towards output lens 303.

Output lens 303 receives third condensed light 374. Output lens 303 changes the magnitude of third condensed light 374. After being refracted by output lens 303, third condensed light 374 becomes condensed light 213. Output lens 303 directs condensed light 213 towards second diffractive array 212. Condensed light 213 forms an illumination field 350a before entering second diffractive array 212. A size of illumination field 350a is at least dependent upon position 320a of first zoom lens 311 and position 321a of second zoom lens 312.

FIG. 3b shows zoom lens section 310 according to a second embodiment of the present invention. In this embodiment, first zoom lens 311 is in a position 320b and second zoom lens 312 is in a position 321b. Condenser system 220 forms an illumination field 350b based on the positioning of lenses 311 and 312. Illumination field 350b can have a different size as compared with illumination field 350a of FIG. 3a.

FIG. 3c shows a zoom lens section 310 according to a third embodiment of the present invention. In this embodiment, first zoom lens 311 is in a position 320c and second zoom lens 312 is in a position 321c. Condenser system 220 forms an illumination field 350c based on the positioning of lenses 311 and 312. Illumination field 350c can have a different size as compared with illumination fields 350a of FIG. 3a and 350b of FIG. 3b.

5-Lens Condenser System

Figure 4A:
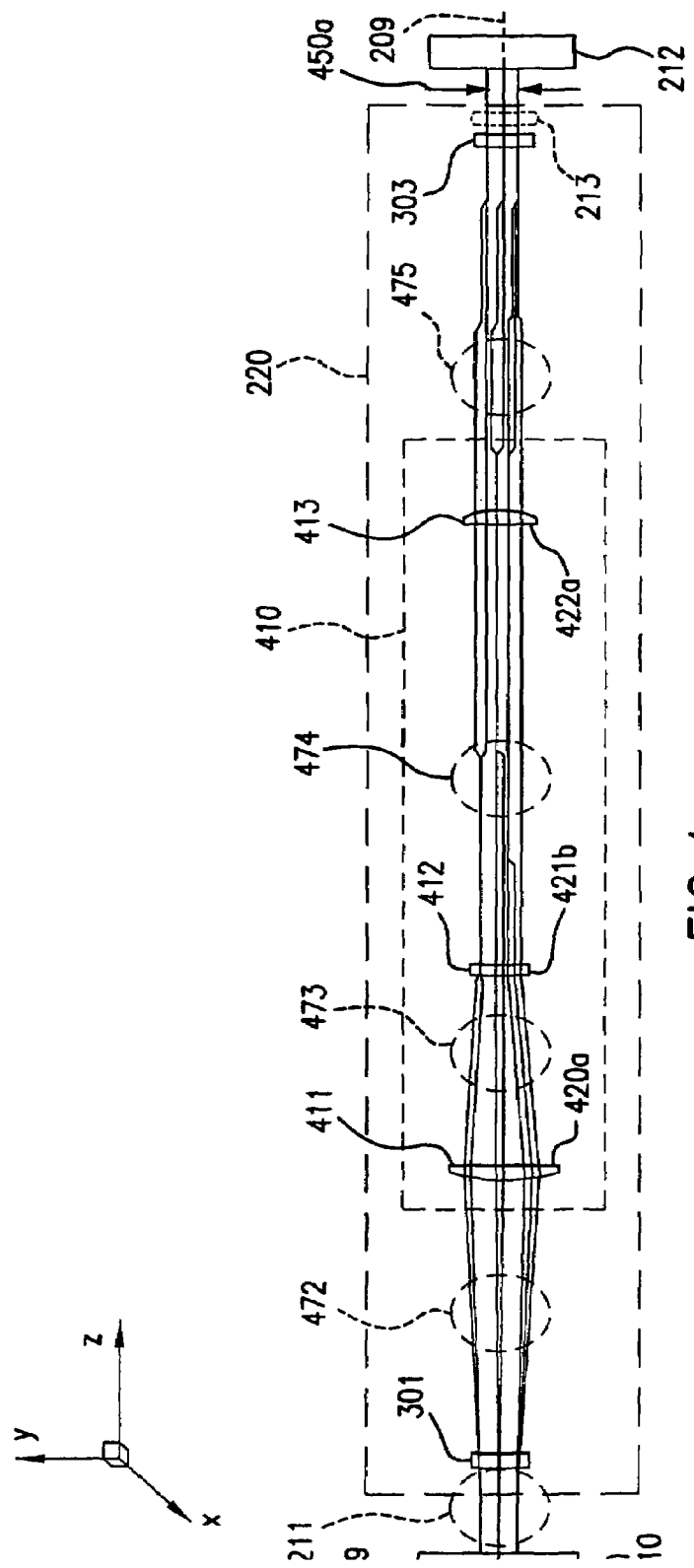
FIG. 4a illustrates an embodiment of a 5-lens condenser system of the illumination system of FIGS. 2a and 2b in a first lens position, according to the present invention.

FIG. 4a illustrates 5-lens condenser system 220 according to an embodiment of the present invention. In this embodiment, 5-lens condenser system 220 includes an input lens 301, an output lens 303, and a zoom lens section 410. Zoom lens section 410 is placed along optical axis 209 between input lens 301 and output lens 303. Zoom lens section 410 includes a first zoom lens 411, a second zoom lens 412, and a third zoom lens 413.

In this embodiment, input lens 301 and output lens 303 are stationary lenses and zoom lens section 410 is capable of translation along optical axis 209 between input lens 301 and output lens 303. First zoom lens 411 is capable of translation along optical axis 209 between input lens 301 and second zoom lens 412. Second zoom lens 412 is capable of translation along optical axis 209 between first zoom lens 411 and third zoom lens 413. Third zoom lens 413 is capable of translation along optical axis 209 between second zoom lens 412 and output lens 303. By translating first zoom lens 411, second zoom lens 412, and/or third zoom lens 413 along optical axis 209, zoom lens section 410 translates along optical axis 209 between input lens 301 and output lens 303.

Adjusting respective distances between input lens 301, first zoom lens 411, second zoom lens 412, third zoom lens 413, and output lens 303, can allow condenser system 220 to condense a light passing through the condenser system 220. The condensed light forms an illumination field 450 before the condensed light passes through second diffractive array 212. The condensed light output from condenser system 220 is capable of varying the size of illumination field 450. Furthermore, the refractive power of input lens 301, first zoom lens 411, second zoom lens 412, third zoom lens 413, and output lens 303 can also affect the magnitude of light passing through condenser system 220 and, hence, affect the size of illumination field 450. Illumination field 450 is partially determinative of a size of delimiter field 228 formed at reticle 106.

Depending on the size of illumination field 450, input lens 301, output lens 303, first zoom lens 411, second zoom lens 412, and third zoom lens 413 can have positive or negative refractive power. Input lens 301 and output lens 303 can be cylindrical lenses having optical powers in a cross-scanning direction (or along the X axis and the Y axis). First zoom lens 411, second zoom lens 412, and third zoom lens 413 can be cylindrical lenses having optical powers in a scanning direction (or along the Y-axis or along the X-axis). In one embodiment, in order to minimize energy loss and/or a range of motion of lenses in zoom lens section 410, during operation of condenser system 220 the ratio of cross-scan optical powers of lenses in zoom lens section 410 can be in the range from about 1:–0.3 to about 1:–0.8. In an alternative embodiment, lenses in the condenser system 220 can be cross-cylindrical lenses.

Figure 4B:
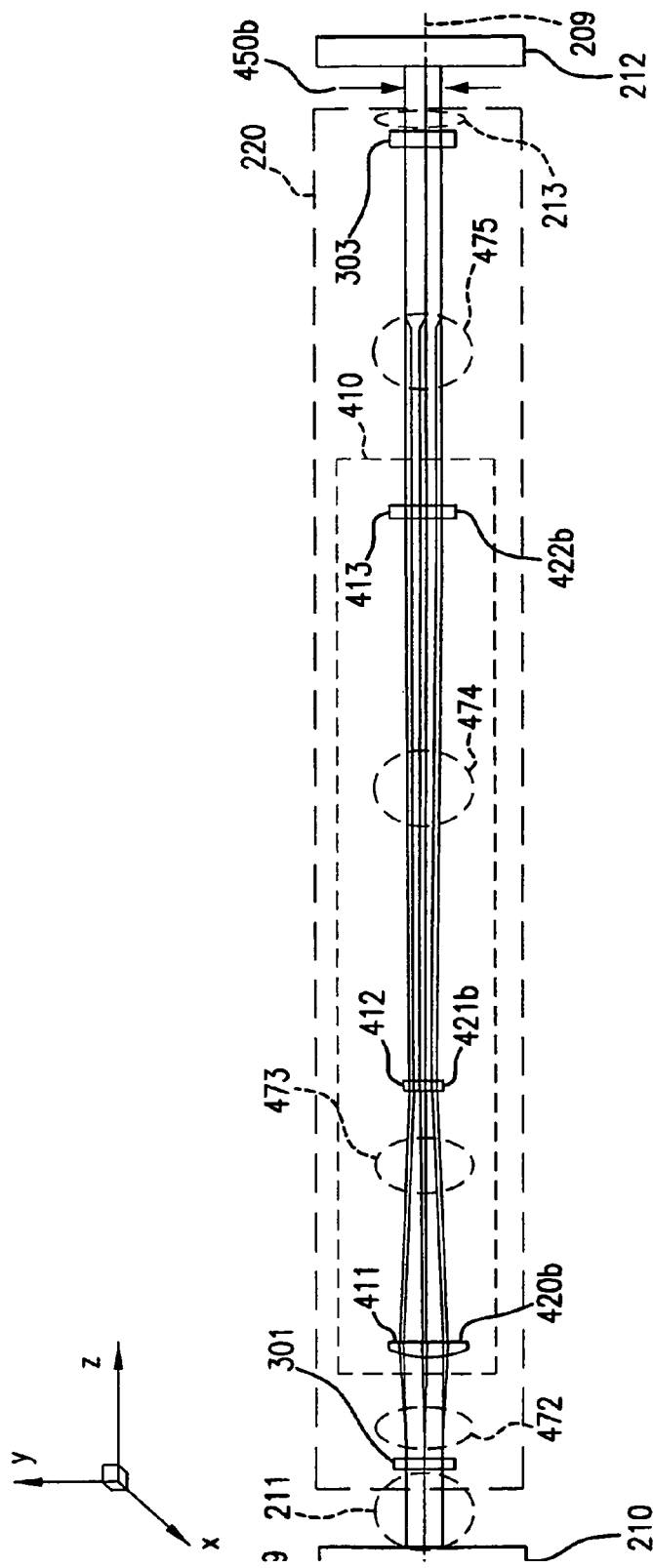
FIG. 4b illustrates the 5-lens condenser system shown in FIG. 4a in a second lens position, according to the present invention.
Figure 4C:
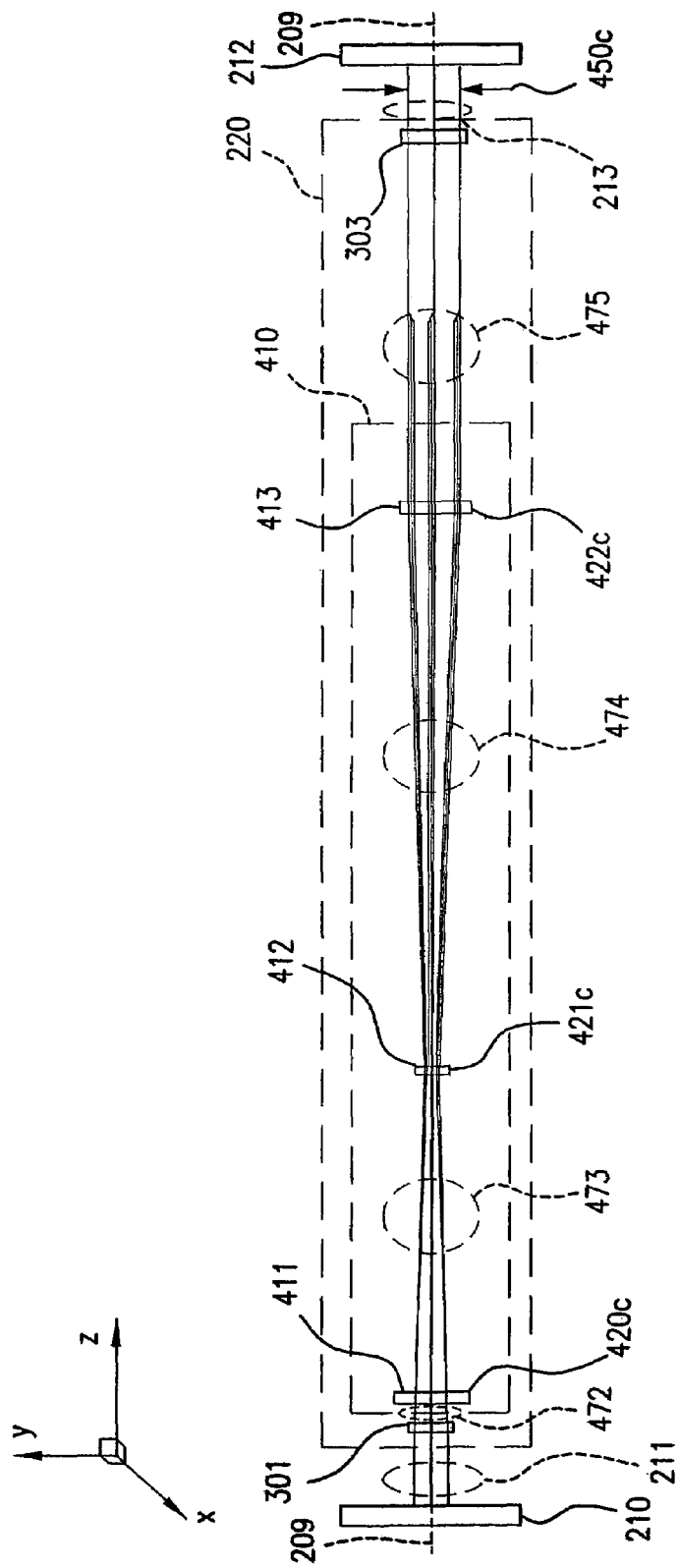
FIG. 4c illustrates the 5-lens condenser system shown in FIG. 4a in a third lens position, according to the present invention
Figure 4D:
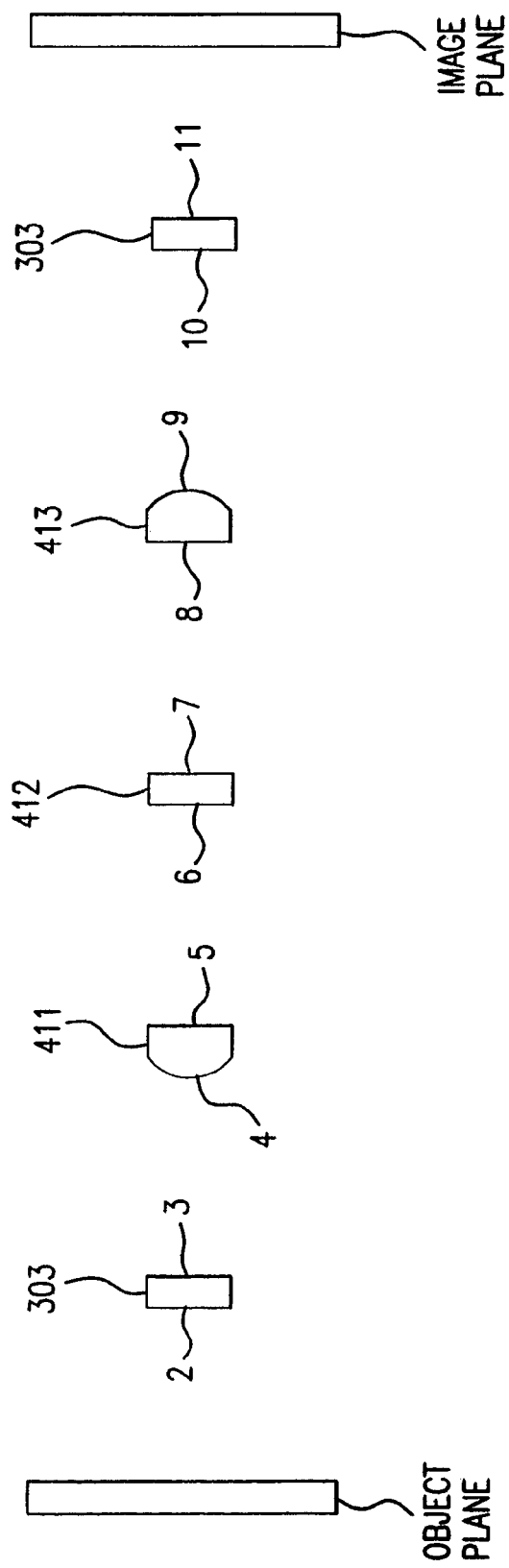
FIG. 4d illustrates a plurality of optical elements along with corresponding optical surfaces of the 5-lens condenser system shown in FIGS. 4a–4c, according to the present invention.

FIG. 4d illustrates optical elements with corresponding optical surfaces of condenser system 220. Input lens 301 has optical surfaces 2 and 3. First zoom lens 411 has optical surfaces 4 and 5. Second zoom lens 412 has optical surfaces 6 and 7. Third zoom lens 413 has optical surfaces 8 and 9. Output lens 303 has optical surfaces 10 and 11. The optical elements are placed between an object plane and an image plane. Tables 2A and 2B, shown above, indicate optical properties of each optical element in condenser system 220 (input lens 301, first zoom lens 411, second zoom lens 412, third zoom lens 413, and output lens 303), such as thickness, radius, material and others.

Light Path in 5-Lens Condenser System

With reference again to FIG. 4a, zoom system 410 is shown according to a first embodiment of the present invention. In this embodiment, light 211 is incident upon input lens 301 of condenser system 220. Input lens 301 changes the magnitude of light 211. After being refracted by input lens 301, light 211 becomes first condensed light 472. Input lens 301 directs first condensed light 472 towards zoom lens section 410.

First zoom lens 411 of zoom lens section 410, while in position 420a, receives first condensed light 472. First zoom lens 411 changes the magnitude of first condensed light 472. After being refracted by first zoom lens 411, first condensed light 472 becomes second condensed light 473. First zoom lens 411 directs second condensed light 473 towards second zoom lens 412, which is in position 421a.

Second zoom lens 412, while in position 421a, receives second condensed light 473. Second zoom lens 412 changes the magnitude of second condensed light 473. After being refracted by second zoom lens 412, second condensed light 473 becomes third condensed light 474. Second zoom lens 412 directs third condensed light 474 towards third zoom lens 413, which is in position 422a.

Third zoom lens 413, while in a position 422a, receives third condensed light 474. Third zoom lens 413 changes the magnitude of third condensed light 474. After being refracted by third zoom lens 413, third condensed light 474 becomes fourth condensed light 475. Third zoom lens 413 directs fourth condensed light 475 towards output lens 303.

Output lens 303 receives fourth condensed light 475. Output lens 303 changes the magnitude of fourth condensed light 475. After being refracted by output lens 303, fourth condensed light 475 becomes condensed light 213. Output lens 303 directs condensed light 213 towards second diffractive array 212. Condensed light 213 forms an illumination field 450a before entering second diffractive array 212. The size of illumination field 450a is at least partially determined by position 420a of first zoom lens 411, position 421a of second zoom lens 412, and position 422a of third zoom lens 413.

FIG. 4b shows zoom lens system 410 according to a second embodiment of the present invention. In this embodiment, first zoom lens 411 is in a position 420b, second zoom lens 412 is in a position 421b, and a third zoom lens 413 is in a position 422b. Condenser system 220 forms an illumination field 450b based on the positions of lenses 411, 412, and 413. Illumination field 450b can have a different size as compared with illumination field 450a of FIG. 4a.

FIG. 4c shows a zoom system 410 according to a third embodiment of the present invention. In this embodiment, first zoom lens 411 has a position 420c, second zoom lens 412 has a position 421c, and a third zoom lens 413 has a position 422c. Condenser system 220 forms an illumination field 450c based on the positions of lenses 411, 412, and 413. Illumination field 450c can have a different size as compared with illumination fields 450a of FIG. 4a and 450b of FIG. 4b.

System Allowing for Varying of both Field Height and Pupil

As discussed above, the various embodiments and systems above allow for a continuously variable field height, but not a continuously variable pupil. However, in some applications a tool needs to be more flexible and have the ability to do both. The systems in FIGS. 7 and 8 can accomplish both operations.

Figure 7:
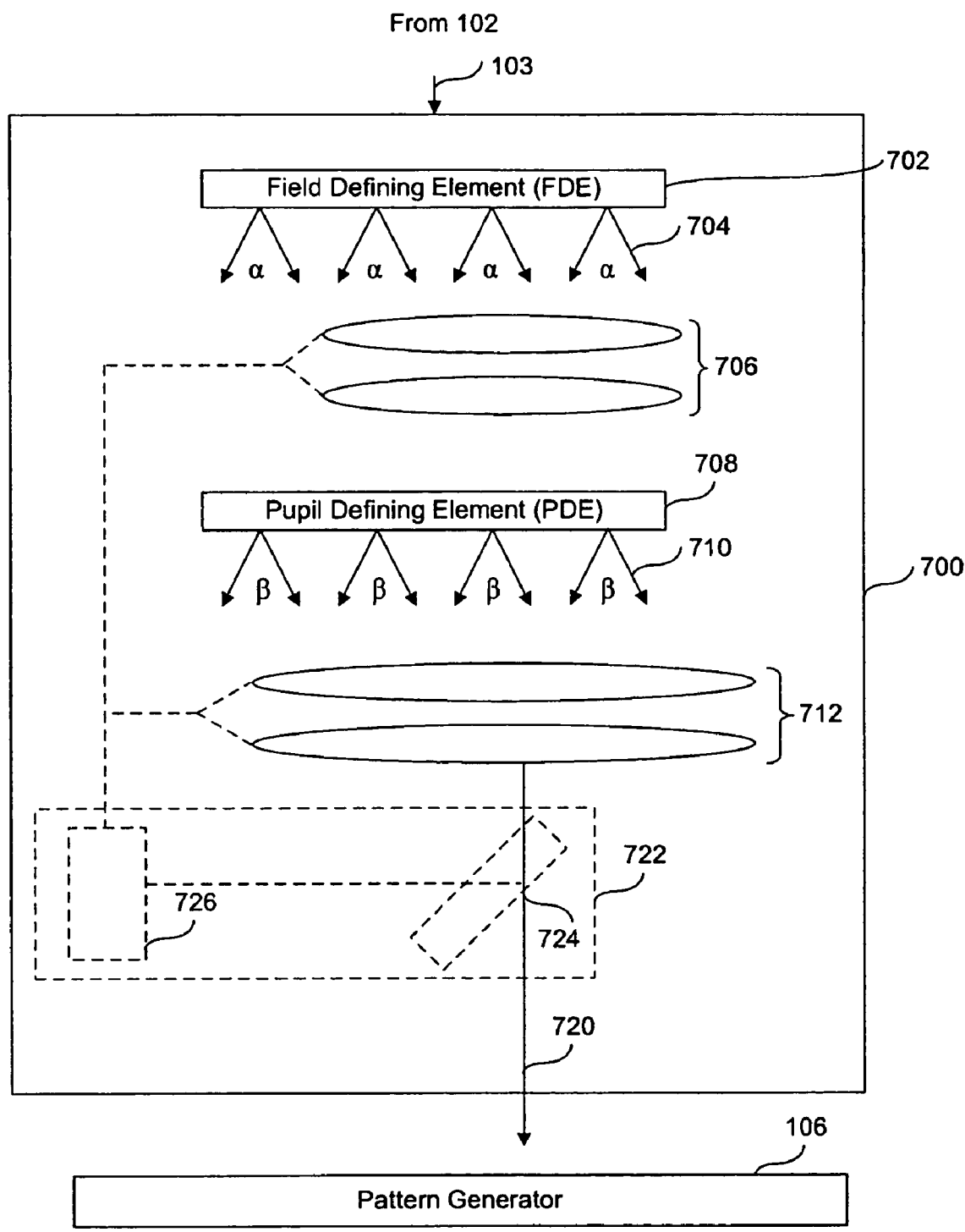
FIGS. 7 and 8 show systems that allow for continuously changing a field height and a pupil, according to embodiments of the present invention.

FIG. 7 shows an optical system 700 according to an embodiment of the present invention. Optical system 700 can be positioned in illumination optics 104 (FIG. 1). Optical system 700 receives light beam 103 at a field defining element (FDE) 702.

At every point of FDE 702 beams 704 are generated that establish a field height of the illumination beam 720, which is used to illuminate the object plane having pattern generator 106 therein. Beams 704 have a field shape (e.g., rectangular, arc, etc.) and have a NA=α. A first zoom system 706 has a focal length of $F_1$ and magnifies the basic shape of beam 704 to size $F_1\alpha$ at pupil defining element (PDE) 708. Thus, varying a zoom (and focal length $F_1$) of first zoom system 706 allows optical system 700 to vary (possibly continuously or dynamically) a field height of illumination beam 720.

At every point of PDE 708 beams 710 are generated that have a NA=β and that establish a pupil shape (e.g., circular, dipole, etc.) of the illumination beam 720. A second zoom system 712 receives beams 710, and has a magnification of $M_2$. Second zoom system 712 magnifies and reshapes the pupil NA to $M_2\beta$ and the field size to $F_1\alpha/M_2$. Thus, varying a zoom (and magnification $M_2$) of second zoom system 712 allows optical system 700 to vary (possibly continuously or dynamically) a pupil of illumination beam 720.

In combination, varying a zoom of first zoom system 706 and second zoom system 712 allows for varying of both field height ($F_1\alpha/M_2$) and pupil ($M_2\beta$). For example, NA of illumination beam 720 at the object plane can be controlled by $M_2$ and then the size of illumination beam 720 at the object plane can be reset using $F_1$. This results in a more precise system that is more flexible in terms of adapting for various applications as compared to the systems described above in FIGS. 2a–4d.

In one embodiment of system 700, an optional detecting system 722 can be used to measure a characteristic (e.g., a wavefront, etc.) of illumination beam 720 to allow for dynamic varying of one or both field height and pupil. Detecting system 722 can include an optical element 724 (e.g., a beam splitter) the directs a part of illumination beam 720 towards a detector or sensor 726. Sensor 726 can be coupled to zoom systems 706 and/or 712 in order to control their movements, such that illumination beam 720 exhibits desired characteristics. It is to be appreciated that this is just one example detecting system, and other detecting systems can be used, as would be apparent to one of ordinary skill in the art upon reading this description. Thus, other types of detecting systems are contemplated within the scope of the present invention.

Figure 8:
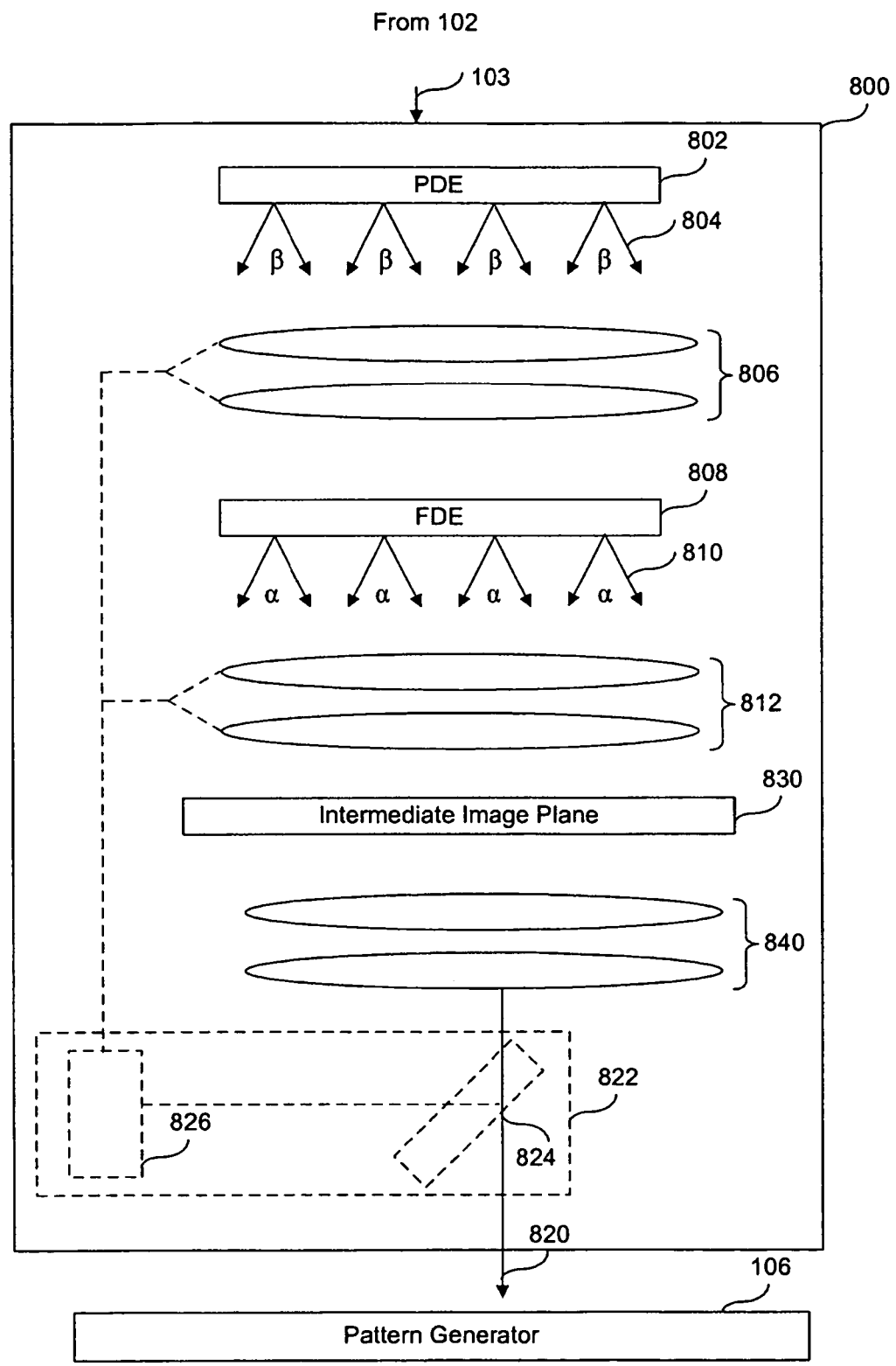

FIG. 8 shows an optical system 800 according to an embodiment of the present invention. Optical system 800 can be positioned in illumination optics 104 (FIG. 1). Optical system 800 receives light beam 103 at a PDE 802.

At every point of PDE 802 beams 804 are generated that establish a pupil shape (e.g., circular, dipole, etc.) of an illumination beam 820, which is used to illuminate the object plane having pattern generator 106 therein. Beams 804 have a NA=β. A first zoom system 806 has a focal length of $F_1$ and magnifies and reshapes the pupil to a size $F_1\beta$. Thus, varying a zoom (and focal length $F_1$) of first zoom system 806 allows optical system 800 to vary (possibly continuously or dynamically) a pupil of illumination beam 820.

At every point of FDE 808 beams 810 are generated that establish a field height of the illumination beam 820. Beams 810 have a field shape (e.g., rectangular, arc, etc.) and have a NA=α. A second zoom system 812 has a focal length of $F_2$ and magnifies the shape of beam 810 at an intermediate image plane 830 to $F_2\alpha$ and NA=$F_1\beta/F_2$. Thus, varying a zoom (and focal length $F_2$) of second zoom system 812 allows optical system 800 to vary (possibly continuously or dynamically) a field height of illumination beam 820.

In this embodiment, system 800 also includes a relay system 840 between intermediate plane 830 and pattern generator 106. Relay system 840 can reimage the pattern and NA of illumination beam 820 at intermediate image plane 830 with a magnification M.

In combination, varying a zoom of first zoom system 806 and second zoom system 812 allows for varying of the pupil ($F_1\beta$) and the field height ($F_2\alpha$ and NA=$F_1\beta/F_2$) of illumination beam 820. For example, a size of illumination beam 820 at intermediate image plane 830 cane be controlled using $F_2$ and then the NA can be reset using $F_1$. This results in a more precise system that is more flexible in terms of adapting for various applications as compared to the system described above in FIGS. 2a–4d.

In one embodiment of system 800, an optional detecting system 822 can be used to measure a characteristic (e.g., a wavefront, etc.) of illumination beam 820. Detecting system 822 can include an optical device 824 (e.g., a beam splitter) the directs a part of illumination beam 820 towards a detector or sensor 826. Sensor 826 can be coupled to zoom systems 806 and/or 812 in order to control their movements, such that illumination beam 820 exhibits desired characteristics. It is to be appreciated that this is just one example detecting system, and other detecting systems can be used as would be apparent to one of ordinary skill in the art upon reading this descriptions. Thus, other types of detecting systems are contemplated within the scope of the present invention.

In both embodiments shown in FIGS. 7 and 8, any desired field height and pupil range can be used, as would be established based on an application incorporating system 700 or 800. For example, for one application a variance in field height can be up to about 2.5 to about 4 times an original field height and a variance in pupil can be up to about 4 to about 5 time an original pupil. However, for other applications other ranges are also contemplated within the scope of the present invention.

It is to be appreciate that first zoom systems 706 and 806 and second zoom systems 712 and 812 can have various numbers and types of optical elements therein, such that a desired zoom operation is achieved. Thus, various combinations of optical elements for these zoom systems are contemplated within the scope of the present invention.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

The invention claimed is:

1. A system comprising:
   a field defining element (FDE) that generates a field height of an illumination beam;
   a first zoom system that allows for changing of the field height of the illumination beam;
   a pupil defining element (PDE) that generates a pupil of the illumination beam; and
   a second zoom system that allows for changing of the pupil of the illumination beam, whereby the illumination beam is used to illuminate an object plane.

2. The system of claim 1, wherein:
   the FDE and the PDE are diffractive optical elements.

3. The system of claim 1, wherein:
   the FDE and the PDE are refractive optical elements.

4. The system of claim 1, further comprising:
   a relay system positioned before the object plane.

5. The system of claim 1, further comprising:
a beam homodigization device positioned so that the illumination beam is homogenized before being received by either the FDE or the PDE.

6. The system of claim 1, wherein the FDE is positioned closer to the object plane than the PDE.

7. The system of claim 1, wherein the PDE is positioned closer to the object plane than the FDE.

8. The system of claim 1, further comprising a pattern generator positioned in the object plane.

9. The system of claim 1, further comprising one of a reticle, a contrast device, and a spatial light modulator positioned in the object plane.

10. The system of claim 1, further comprising a reflective pattern generator positioned in the object plane.

11. The system of claim 1, further comprising a transmissive pattern generator positioned in the object plane.

12. The system of claim 1, wherein the first zoom system changes the field height up to about 2.5 times to about 4 times an original field height.

13. The system of claim 1, wherein the second zoom system changes the pupil up to about 4 times to about 5 times an original pupil.

14. The system of claim 1, further comprising:
a detection system that measures a wavefront of the illumination beam, which is used to control a zoom value for at least one of the first and second zoom systems.

15. The system of claim 1, further comprising:
a detection system that measures a characteristic of the illumination beam, which is used to control a zoom value for at least one of the first and second zoom systems.

16. A system comprising:
means for generating and varying a field height of an illumination beam; and
means for generating and varying a pupil of the illumination beam, such that illumination associated with the pupil has different optical characteristics than illumination associated with the field height and such that radiometric efficiency is continuously maintained.

17. The system of claim 16, further comprising:
means for relaying the illumination beam.

18. The system of claim 16, further comprising:
means for measuring a characteristic of the illumination beam and generating a control signal; and
means for controlling at least one of the means for varying the field height and the means for varying the pupil based on a value of the control signal.

19. A method comprising:
(a) generating a field height of an illumination beam;
(b) varying the field height of the illumination beam;
(c) generating a pupil of the illumination beam; and
(b) varying the pupil of the illumination beam, such that illumination associated with the pupil has different optical characteristics than illumination associated with the field height and radiometric efficiency is maintained.

20. The system of claim 19, further comprising:
(c) relaying the illumination beam.

21. The system of claim 19, further comprising:
(c) measuring a characteristic of the illumination beam;
(d) generating a control signal based on the measuring; and
(e) controlling at least one of steps (a) or (b) based on a value of the control signal.

22. The system of claim 16, wherein the different illumination characteristics comprise at least one of different numerical apertures and different magnifications.

23. The method of claim 19, wherein the different illumination characteristics comprise at least one of different numerical apertures and different magnifications.

* * * * *